(12) United States Patent
Childers et al.

(10) Patent No.: US 7,236,021 B2
(45) Date of Patent: Jun. 26, 2007

(54) METHOD OF CONTROLLING SLOPE AND DEAD TIME IN AN INTEGRATED OUTPUT BUFFER WITH INDUCTIVE LOAD

(75) Inventors: Jim D. Childers, Missouri City, TX (US); Pravin P. Patel, Sugarland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/344,323

(22) Filed: Jan. 31, 2006

(65) Prior Publication Data

US 2006/0170473 A1    Aug. 3, 2006

Related U.S. Application Data

(60) Provisional application No. 60/648,813, filed on Jan. 31, 2005.

(51) Int. Cl.
*H03K 3/00*    (2006.01)
(52) U.S. Cl. ........................................ 327/108; 327/170
(58) Field of Classification Search ........ 327/108–112, 327/170
See application file for complete search history.

(56) References Cited

U.S. PATENT DOCUMENTS

| | | | | | |
|---|---|---|---|---|---|
| 5,565,715 | A | * | 10/1996 | Doluca | 307/130 |
| 5,877,647 | A | * | 3/1999 | Vajapey et al. | 327/391 |
| 5,959,474 | A | * | 9/1999 | Park et al. | 327/112 |
| 6,069,509 | A | * | 5/2000 | Labram | 327/170 |
| 6,307,409 | B1 | * | 10/2001 | Wrathall | 327/112 |
| 6,466,063 | B2 | * | 10/2002 | Chen | 327/112 |
| 6,617,891 | B2 | * | 9/2003 | Srikanth et al. | 327/108 |
| 6,653,878 | B2 | * | 11/2003 | Nolan | 327/170 |
| 7,005,897 | B2 | * | 2/2006 | Lim | 327/112 |
| 7,031,175 | B2 | * | 4/2006 | Dequina et al. | 363/127 |

* cited by examiner

*Primary Examiner*—Kenneth B. Wells
(74) *Attorney, Agent, or Firm*—Robert D. Marshall, Jr.; W. James Brady; Frederick J. Telecky, Jr.

(57) ABSTRACT

A method and apparatus independently controls the increasing rate and the decreasing rate a P-channel power FET and an N-channel power FET driving an inductive load. Circuits inhibit turning ON the P-channel FET until the voltage on the gate of the N-channel FET falls below its turn-on voltage threshold, and turning ON the N-channel FET until the voltage on the gate of the P-channel FET falls below its turn-on voltage threshold.

5 Claims, 5 Drawing Sheets

METHOD OF CONTROLLING SLOPE AND DEAD TIME IN AN INTEGRATED OUTPUT BUFFER WITH INDUCTIVE LOAD

CLAIM OF PRIORITY

This application claims priority under 35 U.S.C. 119(e) (1) to U.S. Provisional Application No. 60/648,813 filed Jan. 31, 2005.

TECHNICAL FIELD OF THE INVENTION

The technical field of this invention is output buffers.

BACKGROUND OF THE INVENTION

It is known to design output buffers to control the slope of the voltage (dV/dt) when driving capacitive loads. However, when driving an inductive load driven by a pulse width modulated (PWM) waveform the known slope control circuitry is ineffective. The output field effect transistor (FET) gates are typically controlled by driving them with integrated RC networks to slow turn-on. Turn-off is deliberately made fast to avoid shoot-thru currents which occur when both output FETs are on at the same time.

SUMMARY OF THE INVENTION

This invention independently controls the slope of the turn-on and turn-off of both N-channel and P-channel output transistors and also independently controls a dead-time between one FET turning off and the other FET turning on.

BRIEF DESCRIPTION OF THE DRAWINGS

These and other aspects of this invention are illustrated in the drawings, in which.

DETAILED DESCRIPTION OF PREFERRED EMBODIMENTS

Figure 1A:
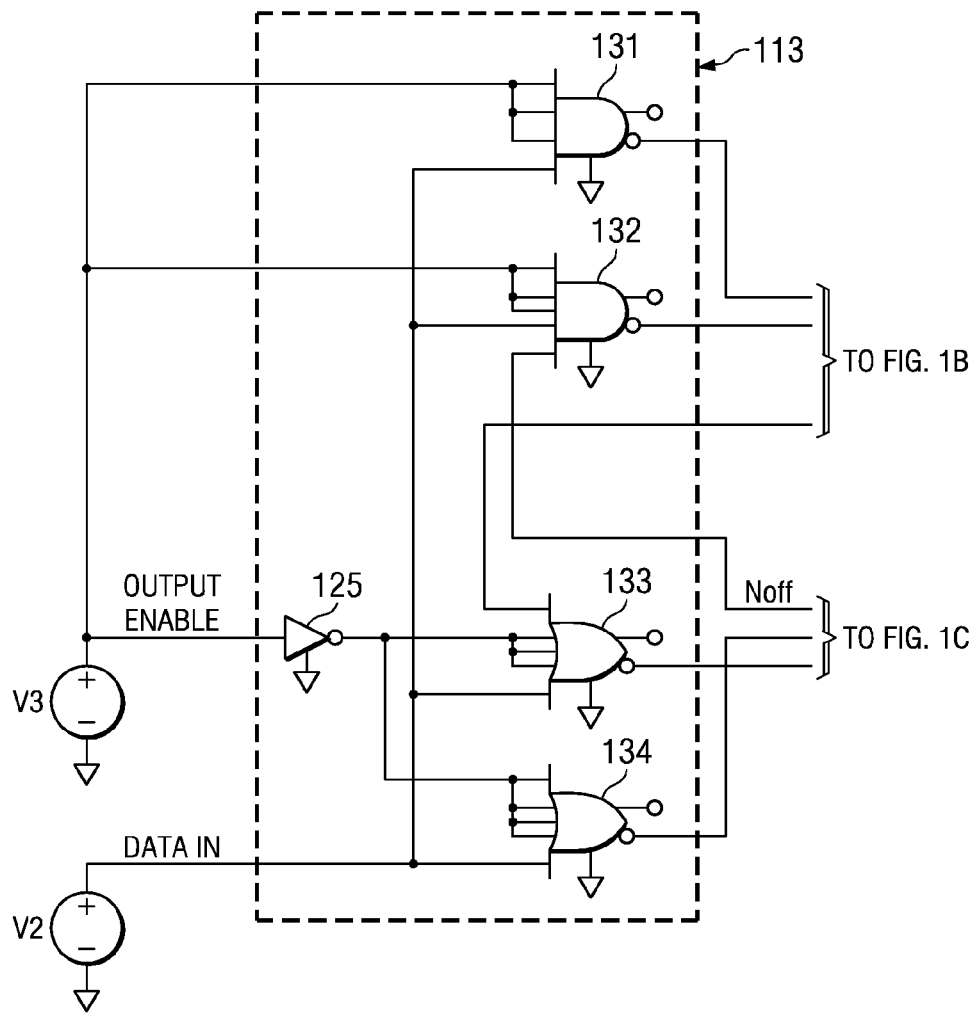
FIGS. 1A, 1B and 1C together illustrate the output buffer of this invention.
Figure 1B:
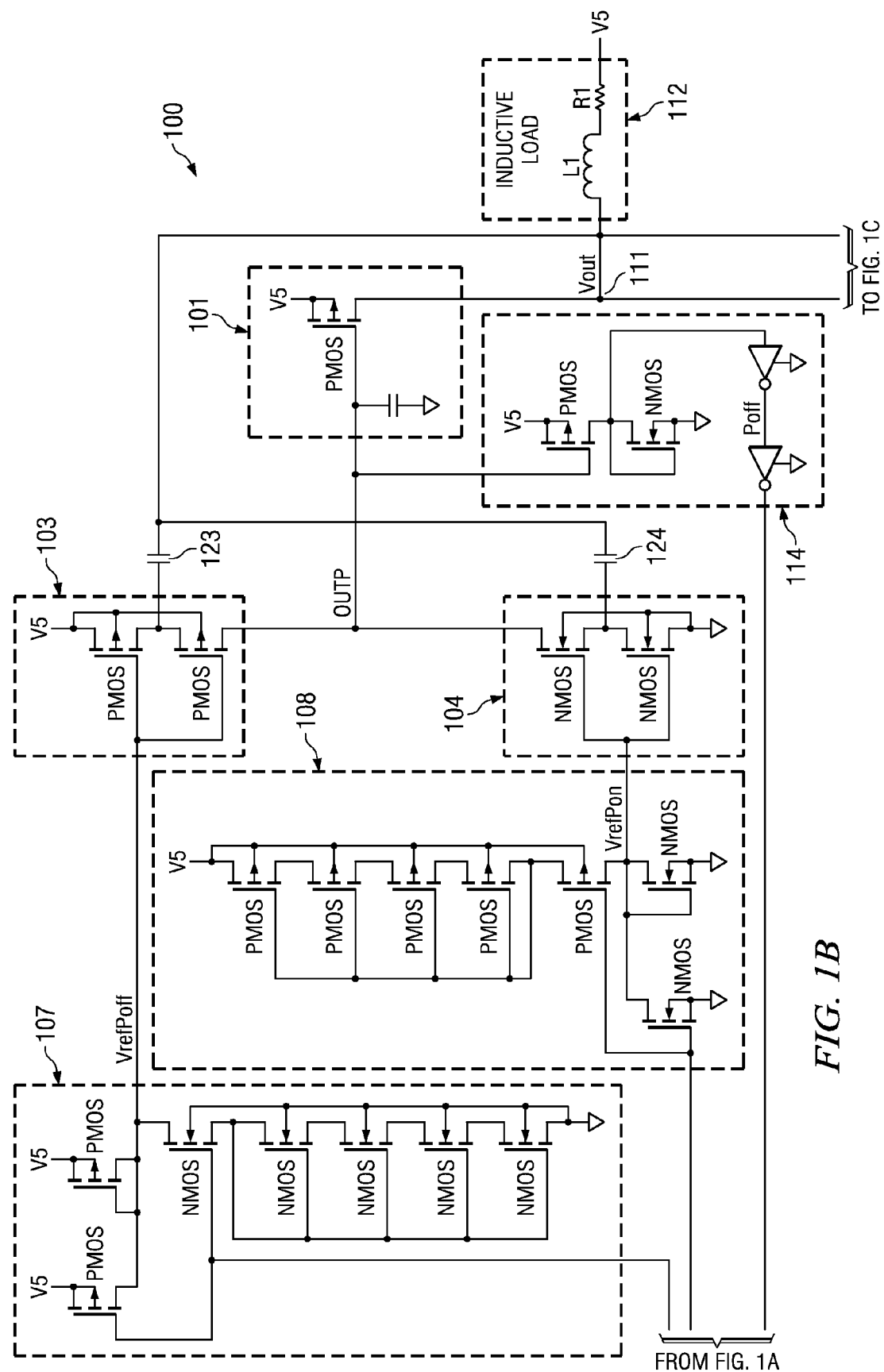
Figure 1C:
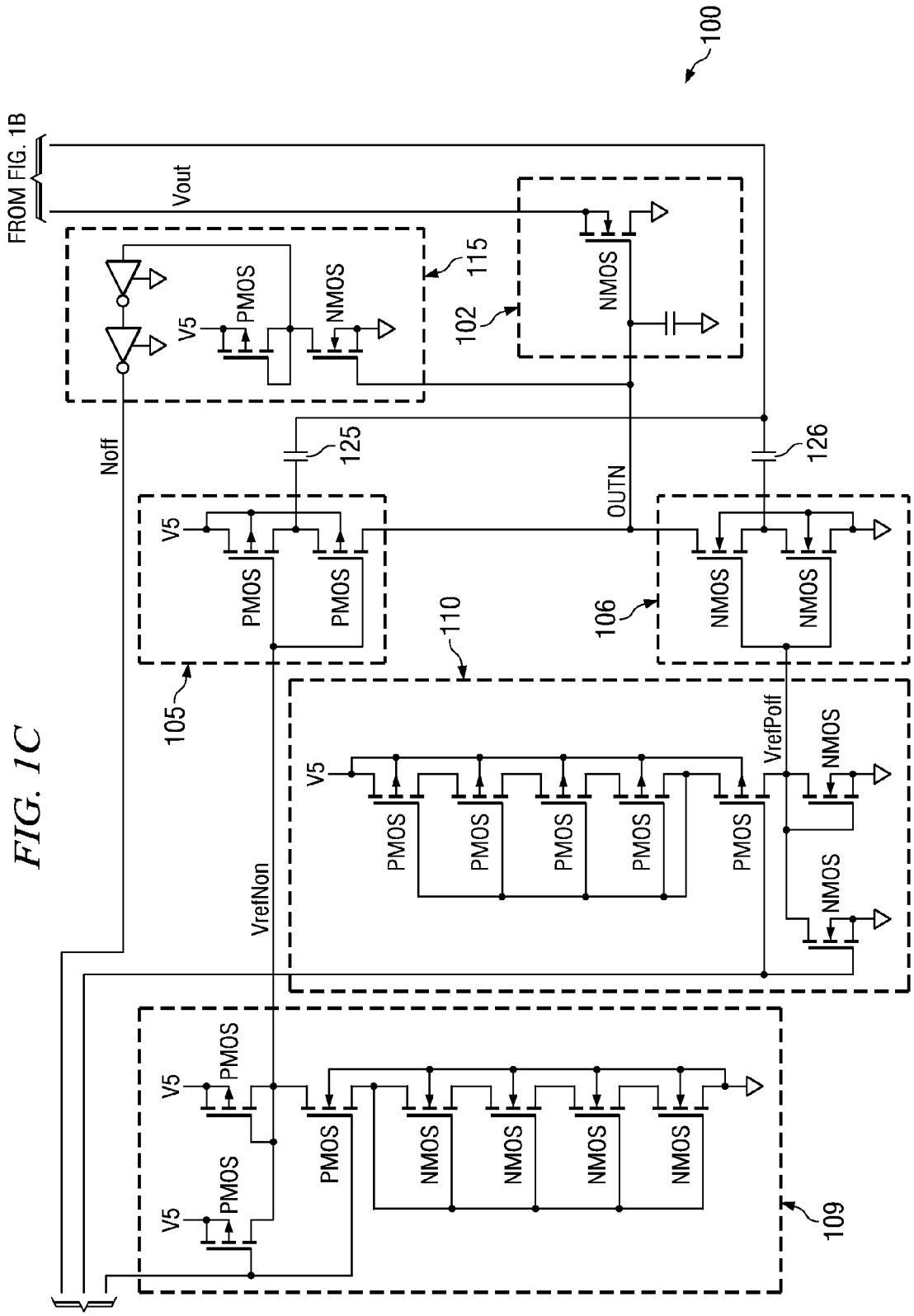

FIG. 1 illustrates an output buffer 100 according to this invention driving inductive load 112. Logic is used in this invention to determine whether N-channel FET 102 or P-channel FET 101 is turned on or turned off. There are thus 4 possibilities. The logic enables a charging circuit 103 for P-channel FET 101, a charging circuit 105 for N-channel FET 102, a discharging circuit 104 for P-channel FET 101 or a discharging circuit 106 for N-channel FET 102. The four circuits each include respective capacitors 123, 124, 125 and 126 fed back from the output of the buffer 111. Each circuit comprises a current-dependent current source. Each capacitor 123, 124, 125, and 126 converts the dV/dt of the output voltage at buffer output 111 to a proportional current. That current then controls the corresponding current-dependent current source when enabled. This in turn modulates the gate drive. Since there are four such circuits, the four slopes associated with the output are independently controlled. The four current-dependent current sources 103, 104, 105 and 106 are controlled by respective voltage references 107, 108, 109 and 110. These voltage references are in turn enabled by logic 113. Two threshold detection circuits 114 and 115 detect when the respective gate is at its corresponding threshold voltage $V_t$. This permits adjustment of the dead-time to greater than zero. In this manner, output buffer 100 holds off turning on N-channel device 102 until P-channel device 101 is off or vice versa. This maintains minimum dead-time while keeping it greater than zero.

The P-channel FETs of current-dependent current source 103 are driven on the opposite phase of data input signal than the N-channel FETs of current-dependent current source 104. Similarly the P-channel FETs of current-dependent current source 105 are driven on the opposite phase of data input signal than the N-channel FETs of current-dependent current source 106. AND gates 131 and 132, OR gates 133 and 134 and inverter 125 operate with the output enable signal and the data input signal to drive FETs 101 and 102 oppositely.

The actual output buffer design is more complex than illustrated in FIG. 1 because it is necessary to turn off the voltage references and current sources except during a transition. This can be accomplished simply by comparing the logical state of the output pin to the logical state of the data input signal. If the two differ, then the appropriate circuits are powered up until the transition is complete.

This invention controls all four slopes of the output signal so it will function with inductive loads with dynamically controlled dead-time. Without these features an inductive load will commutate the output voltage at extremely high rates. This leads to excessive electromagnetic interference (EMI) production as well as possible premature failure of the output buffer transistors.

Figure 2:
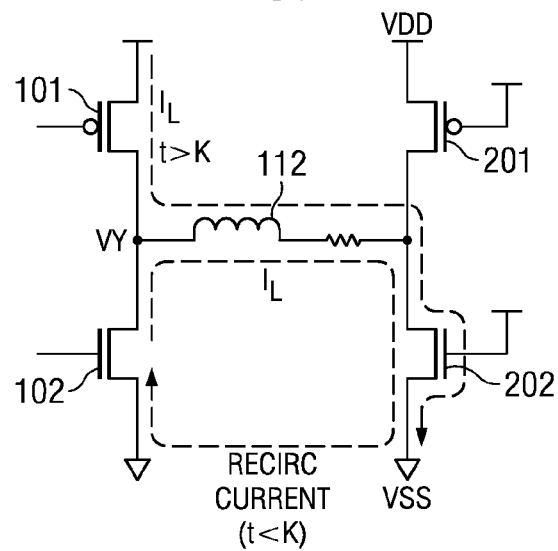
FIG. 2 illustrates the connection of two pair of driver FETs to an inductive load.

FIG. 2 schematically illustrates a physical driver set up. The inductive drive includes two identical output buffers as illustrated in FIG. 1. FIG. 2 illustrates output P-channel FET 101 and output N-channel FET 102 as shown in FIG. 1 and output P-channel FET 201 and output N-channel FET 202 connected to load 112 in an H bridge. FIG. 2 illustrates only the output FETs. Each pair of output FETs is driven by a circuit as illustrated in FIG. 1. Typically, one output buffer is driven by a pulse width modulated (PWM) signal, while the other output buffer is held high or low by the second buffer.

FIGS. 3 to 6 are timing diagrams showing the output of the buffer voltage and the gate drive signals to output P-channel FET 101 and N-channel FET 102 under various conditions. Holding the right end low by turning output P-channel FET 201 OFF and output N-channel FET 202 ON causes recirculation currents to flow through the N-channel transistors 102 and 202 when the PWMed buffer connected to FETs 101 and 102 is driving a low level. This is called N-channel Recirculation. Holding the right end high by turning output P-channel FET 201 ON and output N-channel FET 202 OFF causes recirculation currents to flow through the P-channel transistors 101 and 102 when the PWMed buffer is driving a high level. This is called P-channel Recirculation.

FIGS. 3 to 6 represent the four possible slew control situations and assume there is a current flowing in the inductor due to the PWM drive operation.

Figure 3:
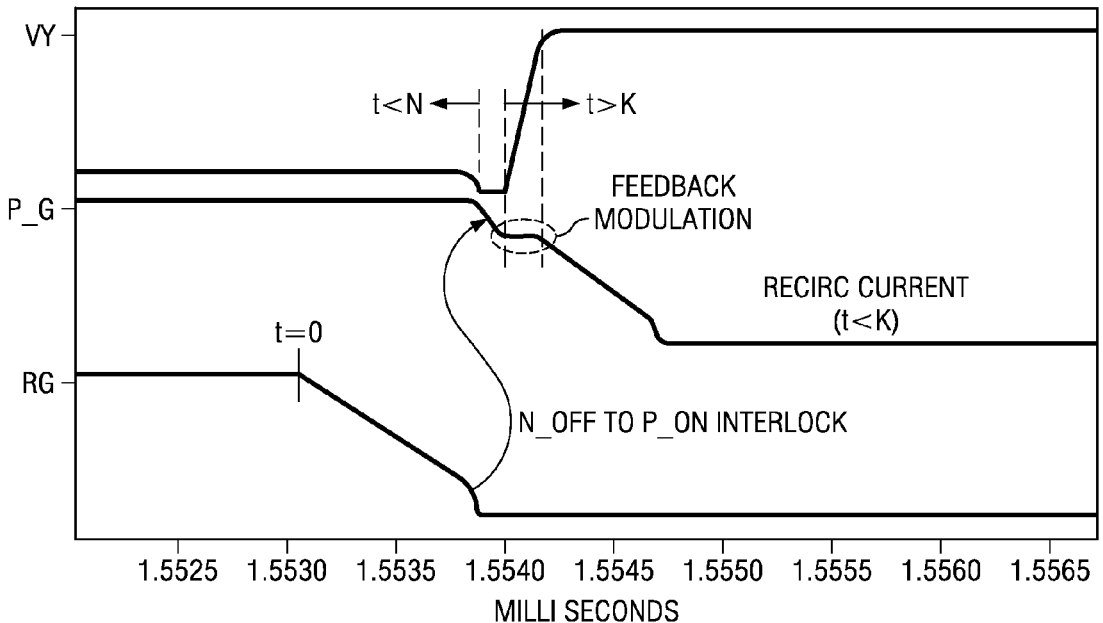
FIG. 3 illustrates voltages of the output of the buffer and the gate voltages of the N-channel and P-channel FET during N-channel recirculation with the output rising.

FIG. 3 illustrates N-channel recirculation with the output voltage rising. The gate of the output P-channel FET 101 being turned ON is modulated by the feedback circuit including capacitor 123 and current-dependent current source 103 to keep the buffer from slewing the output up to the VDD rail too quickly. At the same time the turn-off slope of output N-channel FET 102 is controlled by capacitor 116 and current-dependent current source 106. Threshold feedback circuit 115 prevents AND gate 132 from activating voltage reference circuit 108 until the voltage on the gate of output N-channel FET 102 falls below its voltage threshold $V_t$. Thus there is an interval when both P-channel FET 101 and N-channel FET 102 are OFF during switching. This prevents overcurrent that could be caused by both there transistors being ON simultaneously.

Figure 4:
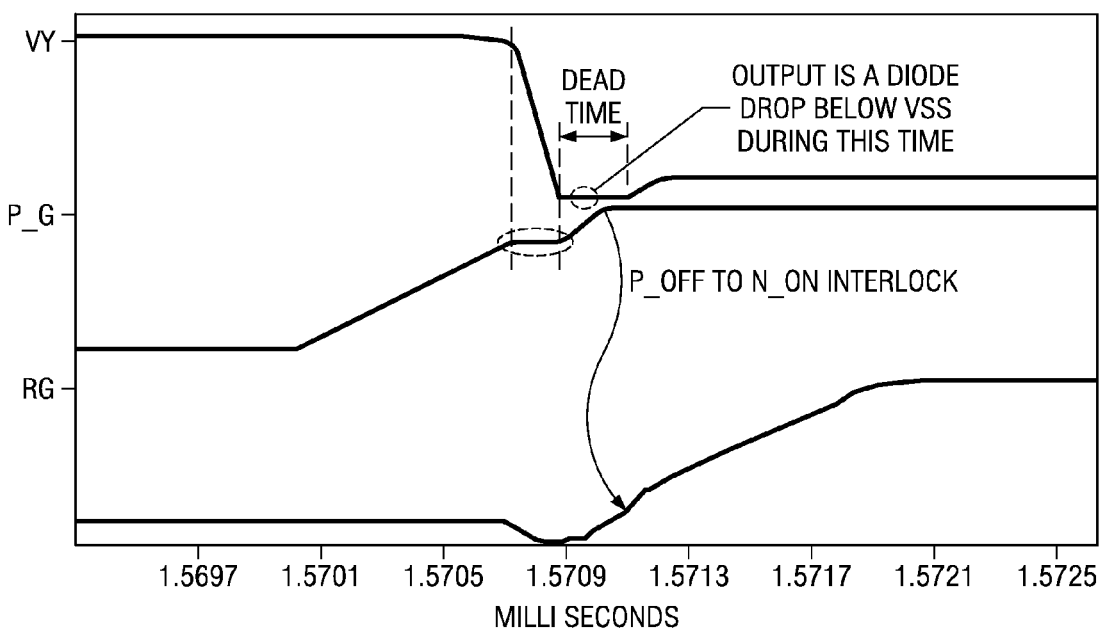
FIG. 4 illustrates voltages of the output of the buffer and the gate voltages of the N-channel and P-channel FET during N-channel recirculation with the output falling.

FIG. 4 illustrates N-channel recirculation with the output voltage falling. The gate of the output P-channel FET 101 being turned OFF is modulated by the feedback circuit including capacitor 124 and current-dependent current source 104 to keep the inductor from snapping the output down to the VSS rail. At the same time the turn-on slope of output N-channel FET 102 is controlled by capacitor 125 and current-dependent current source 105. Threshold feedback circuit 114 prevents OR gate 133 from activating voltage reference circuit 109 until the voltage on the gate of output P-channel FET 101 falls below its voltage threshold $V_t$.

Figure 5:
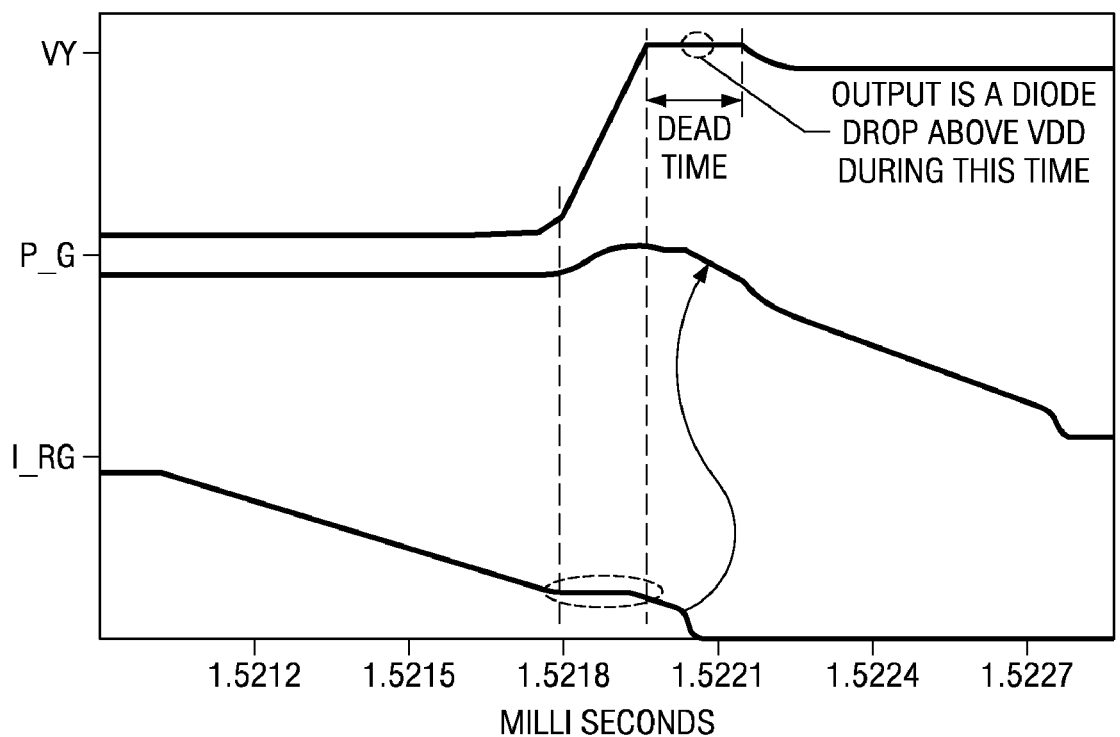
FIG. 5 illustrates voltages of the output of the buffer and the gate voltages of the N-channel and P-channel FET during P-channel recirculation with the output rising.

FIG. 5 illustrates P-channel recirculation with the output voltage rising. The gate of the output N-channel FET 102 being turned OFF is modulated by the feedback circuit including capacitor 126 and current-dependent current source 106 to keep the inductor from snapping the output up to the VDD rail. Threshold feedback circuit 115 prevents AND gate 132 from activating voltage reference circuit 108 until the voltage on the gate of output N-channel FET 102 falls below its voltage threshold $V_t$.

Figure 6:
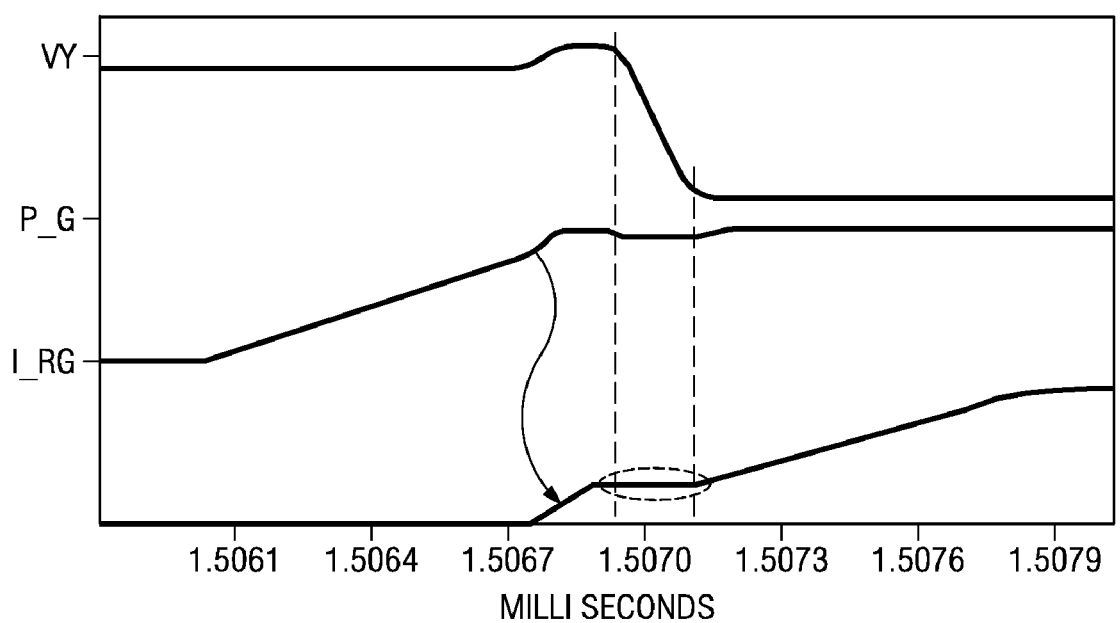
FIG. 6 illustrates voltages of the output of the buffer and the gate voltages of the N-channel and P-channel FET during P-channel recirculation with the output falling.

FIG. 6 illustrates P-channel recirculation with the output voltage falling. The gate of the output N-channel FET 102 transistor being turned ON is modulated by the feedback circuit including capacitor 125 and current-dependent current source 105 to keep the buffer from slewing the output down to the VSS rail too quickly. Threshold feedback circuit 114 prevents OR gate 133 from activating voltage reference circuit 109 until the voltage on the gate of output P-channel FET 101 falls below its voltage threshold $V_t$.

Dead time is the period after the ON transistor turns OFF and before the OFF transistor turns ON. Any currents forced in or out of the output buffer by the inductor will cause the appropriate parasitic diodes across the transistor source-drains to forward bias. With capacitive loads, the buffer voltage doesn't try to change during the dead time. With inductive loads where there is a residual current flowing in the inductor, the inductor will commutate the output from one rail to the other during dead time. This is the purpose of controlling the slope of the transistors being turned OFF as well as the ones turning ON. The slopes of both ON and OFF transitions of both the P-channel FET and the N-channel FET are controlled to prevent improper operation.

What is claimed is:

1. An output buffer comprising:
   a P-channel power FET having a source connected to a supply voltage, a gate and a drain connected to an output terminal;
   an N-channel power FET having a drain connected to the output terminal, a gate and a source connected to ground;
   a first rising voltage drive circuit connected to said gate of said P-channel power FET supplying a rising voltage slope controlled gate drive to said gate of said P-channel FET when activated;
   a first falling voltage drive circuit connected to said gate of said P-channel power FET supplying a falling voltage slope controlled gate drive to said gate of said P-channel FET when activated;
   a second rising voltage drive circuit connected to said gate of said N-channel power FET supplying a rising voltage slope controlled gate drive to said gate of said N-channel FET when activated;
   a second falling voltage drive circuit connected to said gate of said N-channel power FET supplying a falling voltage slope controlled gate drive to said gate of said N-channel FET when activated;
   a first voltage sensing circuit connected to said gate of said P-channel power FET generating a first inhibit signal if a voltage on said gate of said P-channel power FET is above a first predetermined voltage;
   a second voltage sensing circuit connected to said gate of said N-channel power FET generating a second inhibit signal if a voltage on said gate of said N-channel power FET is above a second predetermined voltage;
   a logic drive circuit for alternatively activating (1) said P-channel power FET via said first rising voltage drive circuit and said first falling voltage drive circuit or (2) said N-channel power FET via said second falling voltage drive circuit and said second rising voltage drive circuit, said logic drive circuit including
     an AND gate having a first input receiving a data input signal, a second input receiving said second inhibit signal and an output supplying an activate signal to said first falling voltage drive circuit, and
     an OR gate having a first input receiving a data input signal, a second input receiving said first inhibit signal and an output supplying an activate signal to said second falling voltage drive circuit.

2. An output buffer comprising:
   a P-channel power FET having a source connected to a supply voltage, a gate and a drain connected to an output terminal;
   an N-channel power FET having a drain connected to the output terminal, a gate and a source connected to ground;
   a first rising voltage drive circuit connected to said gate of said P-channel power FET supplying a rising voltage slope controlled gate drive to said gate of said P-channel FET when activated;
   a first falling voltage drive circuit connected to said gate of said P-channel power FET supplying a falling voltage slope controlled gate drive to said gate of said P-channel FET when activated;
   a second rising voltage drive circuit connected to said gate of said N-channel power FET supplying a rising voltage slope controlled gate drive to said gate of said N-channel FET when activated;
   a second falling voltage drive circuit connected to said gate of said N-channel power FET supplying a falling voltage slope controlled gate drive to said gate of said N-channel FET when activated;
   a logic drive circuit for alternatively activating (1) said P-channel power FET via said first rising voltage drive circuit and said first falling voltage drive circuit or (2)

said N-channel power FET via said second falling voltage drive circuit and said second rising voltage circuit; and wherein said first rising voltage drive circuit includes
- a first P-channel FET having a source connected to said supply voltage, a gate receiving an activating signal an a drain;
- a second P-channel FET having a source connected to said drain of said first P-channel FET, a gate receiving said activating signal and a drain connected to said gate of said P-channel power FET; and
- a capacitor connected between said output terminal and said drain of said first P-channel FET.

3. An output buffer comprising:
   a P-channel power FET having a source connected to a supply voltage, a gate and a drain connected to a output terminal;
   an N-channel power FET having an drain connected to the output terminal, a gate and a source connected to ground;
   a first rising voltage drive circuit connected to said gate of said P-channel power FET supplying a rising voltage slope controlled gate drive to said gate of said P-channel FET when activated;
   a first falling voltage drive circuit connected to said gate of said P-channel power FET supplying a falling voltage slope controlled gate drive to said gate of said P-channel FET when activated;
   a second rising voltage drive circuit connected to said gate of said N-channel power FET supplying a rising voltage slope controlled gate drive to said gate of said N-channel FET when activated;
   a second falling voltage drive circuit connected to said gate of said N-channel power FET supplying a falling voltage slope controlled gate drive to said gate of said N-channel FET when activated;
   a logic drive circuit for alternatively activating (1) said P-channel power FET via said first rising voltage drive circuit and said first falling voltage drive circuit or (2) said N-channel power FET via said second falling voltage drive circuit and said second rising voltage circuit; and
   wherein said first falling voltage drive circuit includes
   - a first N-channel FET having a source connected to said ground, a gate receiving an activating signal an a drain;
   - a second N-channel FET having a source connected to said drain of said first N-channel FET, a gate receiving said activating signal and a drain connected to said gate of said P-channel power FET; and
   - a capacitor connected between said output terminal and said drain of said first N-channel FET.

4. An output buffer comprising:
   a P-channel power FET having a source connected to a supply voltage, a gate and a drain connected to an output terminal;
   an N-channel power FET having a drain connected to the output terminal, a gate and a source connected to ground;
   a first rising voltage drive circuit connected to said gate of said P-channel power FET supplying a rising voltage slope controlled gate drive to said gate of said P-channel FET when activated;
   a first falling voltage drive circuit connected to said gate of said P-channel power FET supplying a falling voltage slope controlled gate drive to said gate of said P-channel FET when activated;
   a second rising voltage drive circuit connected to said gate of said N-channel power FET supplying a rising voltage slope controlled gate drive to said gate of said N-channel FET when activated;
   a second falling voltage drive circuit connected to said gate of said N-channel power FET supplying a falling voltage slope controlled gate drive to said gate of said N-channel FET when activated;
   logic drive circuit for alternatively activating (1) said P-channel power FET via said first rising voltage drive circuit and said first falling voltage drive circuit or (2) said N-channel power FET via said second falling voltage drive circuit and said second rising voltage circuit; and
   wherein said second rising voltage drive circuit includes
   - a first P-channel FET having a source connected to said supply voltage, a gate receiving an activating signal an a drain;
   - a second P-channel FET having a source connected to said drain of said first P-channel FET, a gate receiving said activating signal and a drain connected to said gate of said N-channel power FET; and
   - a capacitor connected between said output terminal and said drain of said first P-channel FET.

5. An output buffer comprising:
   a P-channel power FET having a source connected to a supply voltage, a gate and a drain connected to an output terminal;
   an N-channel power FET having a drain connected to the output terminal, a gate and a source connected to ground;
   a first rising voltage drive circuit connected to said gate of said P-channel power FET supplying a rising voltage slope controlled gate drive to said gate of said P-channel FET when activated;
   a first falling voltage drive circuit connected to said gate of said P-channel power FET supplying a falling voltage slope controlled gate drive to said gate of said P-channel FET when activated;
   a second rising voltage drive circuit connected to said gate of said N-channel power FET supplying a rising voltage slope controlled gate drive to said gate of said N-channel FET when activated;
   a second falling voltage drive circuit connected to said gate of said N-channel power FET supplying a falling voltage slope controlled gate drive to said gate of said N-channel FET when activated;
   a logic drive circuit for alternatively activating (1) said P-channel power FET via said first rising voltage drive circuit and said first falling voltage drive circuit or (2) said N-channel power FET via said second falling voltage drive circuit and said second rising voltage circuit; and
   wherein said second falling voltage drive circuit includes
   - a first N-channel FET having a source connected to said ground, a gate receiving an activating signal an a drain;
   - a second N-channel FET having a source connected to said drain of said first N-channel FET, a gate receiving said activating signal and a drain connected to said gate of said N-channel power FET; and
   - a capacitor connected between said output terminal and said drain of said first N-channel FET.

* * * * *